United States Patent
Park et al.

(10) Patent No.: US 11,847,275 B2
(45) Date of Patent: Dec. 19, 2023

(54) DISPLAY DEVICE

(71) Applicant: Samsung Display Co., Ltd., Yongin-si (KR)

(72) Inventors: Soyeon Park, Yongin-si (KR); Kwanghyeok Kim, Cheonan-si (KR); Miyoung Kim, Hwaseong-si (KR); Yong-Hwan Park, Hwaseong-si (KR); Sanghyun Jun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/086,434

(22) Filed: Nov. 1, 2020

(65) Prior Publication Data

US 2021/0271367 A1    Sep. 2, 2021

(30) Foreign Application Priority Data

Feb. 27, 2020    (KR) .................. 10-2020-0024218

(51) Int. Cl.
  *G06F 3/041*  (2006.01)
  *G06F 3/044*  (2006.01)
  *H10K 59/40*  (2023.01)

(52) U.S. Cl.
  CPC ........ *G06F 3/04164* (2019.05); *G06F 3/0412* (2013.01); *G06F 3/0443* (2019.05); *G06F 3/0446* (2019.05); *H10K 59/40* (2023.02); *G06F 2203/04112* (2013.01)

(58) Field of Classification Search
None
See application file for complete search history.

(56) References Cited

U.S. PATENT DOCUMENTS

| | | | |
|---|---|---|---|
| 9,417,747 B2 | 8/2016 | Yumoto et al. | |
| 9,582,087 B2 | 2/2017 | Kang | |
| 2014/0145977 A1* | 5/2014 | Kang | G06F 3/0443 |
| | | | 345/173 |
| 2018/0321765 A1* | 11/2018 | Chiang | H01L 27/323 |
| 2019/0006428 A1* | 1/2019 | Qi | H01L 51/56 |
| 2020/0150806 A1* | 5/2020 | Kim | G06F 3/0412 |
| 2020/0186631 A1* | 6/2020 | Ye | H04M 1/0266 |

FOREIGN PATENT DOCUMENTS

| | | |
|---|---|---|
| KR | 10-2015-0078764 | 7/2015 |
| KR | 10-1607147 | 3/2016 |
| KR | 10-2016-0099791 | 8/2016 |
| KR | 10-2021564 | 9/2019 |

* cited by examiner

*Primary Examiner* — Brian M Butcher
(74) *Attorney, Agent, or Firm* — H.C. Park & Associates, PLC

(57) ABSTRACT

Provided is a display device which includes a display panel that includes an active area and a peripheral area and an input sensing layer that includes a first conductive layer and a second conductive layer. The first conductive layer includes first trace lines and second trace lines. The second conductive layer includes first sensing electrodes and second sensing electrodes. The first trace lines extend in a second direction, are disposed apart from each other in a first direction, and are electrically connected to the first sensing electrodes, respectively. The second trace lines extend in the second direction, are disposed apart from each other in the first direction, and are electrically connected to the second sensing electrodes, respectively. The first conductive layer and the second conductive layer overlap the active area of the display panel.

20 Claims, 10 Drawing Sheets

DISPLAY DEVICE

CROSS-REFERENCE TO RELATED APPLICATION

This application claims priority from and the benefit of Korean Patent Application No. 10-2020-0024218, filed on Feb. 27, 2020, which is hereby incorporated by reference for all purposes as if fully set forth herein.

BACKGROUND

Field

Exemplary embodiments of the present invention relate to a display device, and more particularly, to a display device capable of sensing an external input.

Discussion of the Background

Multimedia apparatuses such as televisions, mobile phones, tablet computers, navigation devices, and game consoles include display devices for displaying images. Such a display device may include an input sensor capable of providing a touch-based input method that enables a user to input information or commands easily, intuitively, and conveniently, in addition to typical input methods such as a button, a keyboard, and a mouse.

The input sensor senses the input from the user and provides the sensed signals to a controller via signal lines and pads. As the number of sensing electrodes provided in the input sensor increases, the large number of the signal lines are required. Also, some of the signal lines need to be disposed in a bezel area of the display device. Recently, various efforts to minimize the bezel area of the display device have been made.

The above information disclosed in this Background section is only for understanding of the background of the inventive concepts, and, therefore, it may contain information that does not constitute prior art.

SUMMARY

Devices constructed according to exemplary implementations/embodiments of the invention are drawn to a display device and touch sensor capable of minimizing a bezel area.

Additional features of the inventive concepts will be set forth in the description which follows, and in part will be apparent from the description, or may be learned by practice of the inventive concepts.

An embodiment of the present invention provides a display device including: a display panel which includes an active area and a peripheral area disposed outside the active area; and an input sensing layer which is disposed on the display panel and includes a first conductive layer and a second conductive layer. The first conductive layer includes first trace lines and second trace lines insulated from the first trace lines. The second conductive layer includes first sensing electrodes extending in a first direction and disposed apart from each other in a second direction, and second sensing electrodes disposed apart from each other in the first direction and the second direction. The first trace lines extend in the second direction, are disposed apart from each other in the first direction, and are electrically connected to the first sensing electrodes, respectively. The second trace lines extend in the second direction, are disposed apart from each other in the first direction, and are electrically connected to the second sensing electrodes, respectively. The first conductive layer and the second conductive layer overlap the active area of the display panel.

In an embodiment, the input sensing layer may further include: first signal lines connected to the first trace lines; and second signal lines connected to the second trace lines.

In an embodiment, the first signal lines and the second signal lines may overlap the peripheral area of the display panel.

In an embodiment, the first signal lines and the second signal lines may be provided in the first conductive layer.

In an embodiment, the display device may further include a first insulating layer disposed between the first conductive layer and the second conductive layer.

In an embodiment, each of the first sensing electrodes may be electrically connected to a corresponding one of the first trace lines via a first contact hole that passes through the first insulating layer.

In an embodiment, each of the second sensing electrodes may be electrically connected to a corresponding one of the second trace lines via a second contact hole that passes through the first insulating layer.

In an embodiment, each of the first trace lines may include: a first trace electrode which overlaps a corresponding one of the first sensing electrodes; and a line portion which is electrically connected to the first trace electrode and extends in the second direction.

In an embodiment, each of the first sensing electrodes and the second sensing electrodes may have a mesh shape.

In an embodiment, the first trace electrode may have a mesh shape.

In an embodiment, when the number of the first sensing electrodes is greater than the number of the second sensing electrodes, a size of the first trace electrode may be smaller than a size of the corresponding one of the first sensing electrodes.

In an embodiment, when the number of the first sensing electrodes is less than or equal to the number of the second sensing electrodes, a size of the first trace electrode may be equal to a size of the corresponding one of the first sensing electrodes.

In an embodiment, the first trace lines may have the same length in the second direction.

In an embodiment, each of the second trace lines may include: trace portions, each of which overlaps a corresponding one of the second sensing electrodes; and a connection electrode which electrically connects the trace portions.

In an embodiment, a size of each of the trace portions may be equal to a size of the corresponding one of the second sensing electrodes.

n an embodiment, when the number of the first sensing electrodes is greater than the number of the second sensing electrodes, the number of the first trace lines may be greater than the number of the second trace lines.

In an embodiment, when the number of the first sensing electrodes is greater than the number of the second sensing electrodes, some of the first sensing electrodes may be disposed adjacent to each other.

In an embodiment, the display panel may include: a base layer including the active area and the peripheral area; a circuit element layer which includes a pixel disposed in the active area of the base layer; a light emitting element layer which includes light emitting elements provided on the circuit element layer; and a thin film encapsulation layer configured to cover the light emitting element layer and including an organic layer.

In an embodiment, the first conductive layer of the input sensing layer may be disposed directly on a top portion of the thin film encapsulation layer.

In an embodiment, the display device may further include an anti-reflection unit configured to reduce reflectivity of external light, wherein the anti-reflection unit is disposed on the thin film encapsulation layer.

It is to be understood that both the foregoing general description and the following detailed description are exemplary and explanatory and are intended to provide further explanation of the invention as claimed.

BRIEF DESCRIPTION OF THE FIGURES

The accompanying drawings are included to provide a further understanding of the present invention, and are incorporated in and constitute a part of this specification. The drawings illustrate exemplary embodiments of the present invention and, together with the description, serve to explain principles of the present invention.

DETAILED DESCRIPTION

Figure 1:
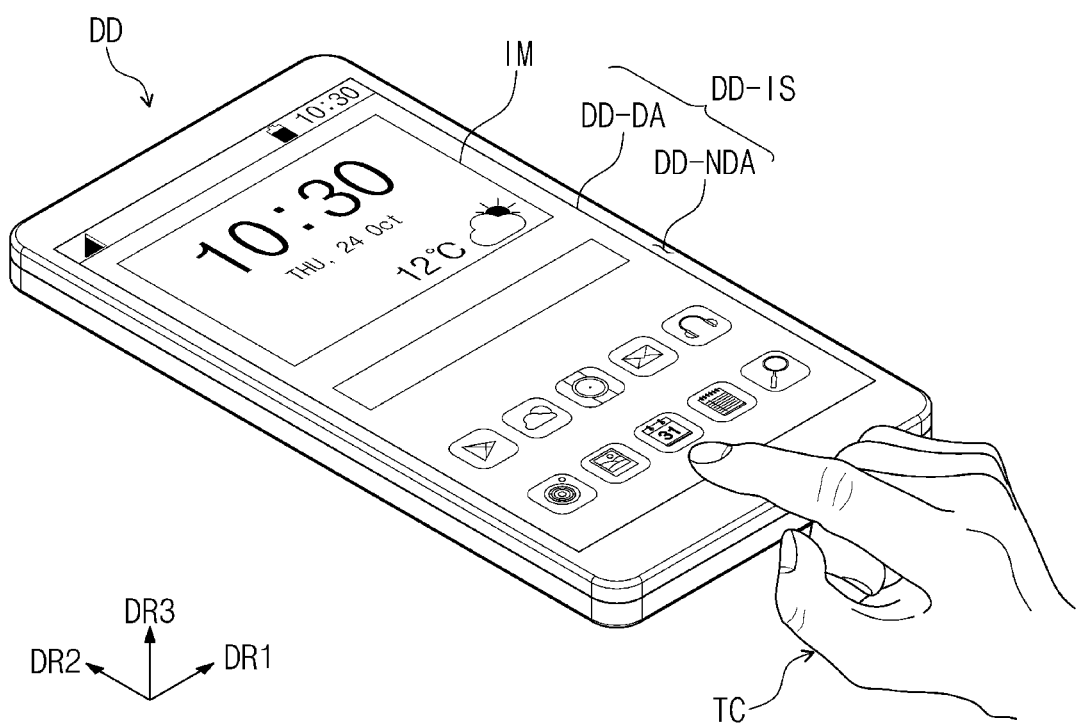
FIG. 1 is a perspective view of a display device according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concepts will be described with reference to the accompanying drawings.

Figure 2:
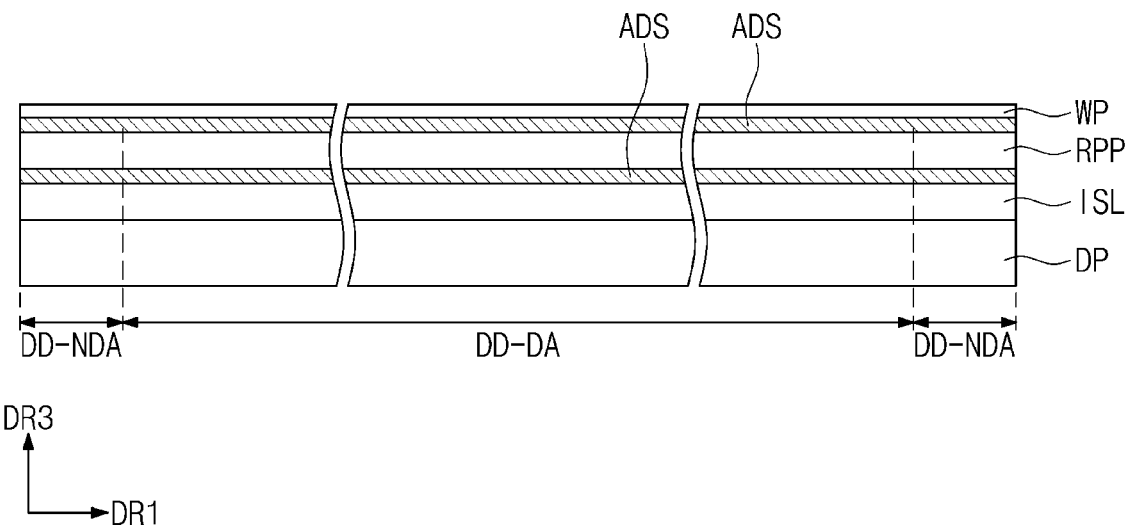
FIG. 2 is a cross-sectional view of a display device according to an embodiment of the inventive concepts.

FIG. 1 is a perspective view of a display device DD according to an embodiment of the inventive concepts. FIG. 2 is a cross-sectional view of the display device DD according to the embodiment of the inventive concepts.

As illustrated in FIG. 1, the display device DD may display an image IM through a display surface DD-IS. The display surface DD-IS is parallel to a plane defined by a first direction axis DR1 and a second direction axis DR2. A normal direction of the display surface DD-IS, that is, a thickness direction of the display device DD, is indicated as a third direction axis DR3.

A front surface (or a top surface) and a rear surface (or a bottom surface) of each of components or members described below are distinguished by the third direction axis DR3. However, the first to third direction axes DR1, DR2, and DR3 illustrated in the exemplary embodiment are merely examples. Hereinafter, first to third directions are defined as the directions indicated by the first to third direction axes DR1, DR2, and DR3, respectively, and referred to as the same reference symbols.

The display device DD having a flat display surface is illustrated in the exemplary embodiment of the inventive concepts, but embodiments of the inventive concepts are not limited thereto. The display device DD may include a curved display surface. The display device DD may include a stereoscopic display surface. The stereoscopic display surface has display areas indicating different directions and may include, for example, a polygonal prism-shaped display surface.

The display device DD according to the exemplary embodiment may be a rigid display device. However, embodiments of the inventive concepts are not limited thereto, and the display device DD according to the embodiment may be a flexible display device. The flexible display device may include a foldable display device which may be folded and a bendable display device of which a portion is bent.

In the exemplary embodiment, the display device DD which may be utilized in a mobile terminal is illustrated as an example in FIG. 1. Although not shown, electronic modules, a camera module, a power module, or the like mounted on a mainboard are disposed with the display device DD in a bracket/case or like, and thus, the mobile terminal may be constituted. The display device DD according to an embodiment of the inventive concepts may be used in large scale electronic apparatuses such as televisions and monitors, as well as, in small-to-medium scale electronic apparatuses such as tablets, vehicular navigation devices, game consoles, and smart watches.

As illustrated in FIG. 1, the display surface DD-IS includes an image area DD-DA on which the image IM is displayed and a bezel area DD-NDA adjacent to the image area DD-DA. The bezel area DD-NDA is an area on which an image is not displayed. In FIG. 1, application icons are illustrated as one example of the image IM.

As illustrated in FIG. 1, the image area DD-DA may have a substantially quadrangular shape. The "substantially quadrangular shape" may include not only a quadrangular shape having mathematical meaning but also a quadrangular shape in which not a vertex but a curved boundary is defined in a vertex area (a corner area).

The bezel area DD-NDA may surround the image area DD-DA. However, embodiments of the inventive concepts are not limited thereto, and the shapes of the image area DD-DA and the bezel area DD-NDA may be designed into other shapes. The bezel area DD-NDA may be disposed on only one side of the image area DD-DA. According to a coupling state between the display device DD and other elements of an electronic device (not shown), the bezel area DD-NDA may not be exposed to the outside.

The display device DD according to an exemplary embodiment of the inventive concepts may sense an input TC of a user applied from the outside. The input TC of the user may be one or a combination of various external inputs such as a portion of the body of the user or a tool, for example, a stylus pen. The display device DD senses a change in one or a combination of reflected light, a temperature, a pressure, an ultrasonic wave, and electromagnetism due to the input TC of the user, and thus, the input TC of the user may be sensed. The input TC of the user illustrated in the exemplary embodiment is assumed to be a touch input by a hand of the user applied to the front surface of the display device DD. However, this is merely an example, and the input TP of the user may be provided in various forms as described above. Also, the display device DD may also sense the input TC of the user applied to a side surface or a bottom surface of the display device DD depending on a structure of the display device DD, but is not limited to one embodiment.

FIG. 2 illustrates a cross-section of a display device DD defined by the first direction axis DR1 and the third direction axis DR3. In FIG. 2, components of the display device DD are illustrated schematically to explain a stacked relationship thereof.

The display device DD according to an exemplary embodiment of the inventive concepts may include a display panel DP, an input sensing layer ISL, an anti-reflector RPP, and a window WP. At least some components of a display panel DP, an input sensing layer ISL, an anti-reflector RPP, or a window WP may be formed through continuous processes, or at least some components thereof may be coupled to each other through adhesive members. An adhesive member ADS may be a pressure sensitive adhesive film (PSA), or a transparent adhesive member such as an optically clear adhesive film (OCA) or an optically clear resin (OCR). The adhesive member described below may include a general adhesive or bonding agent. In an exemplary embodiment of the inventive concepts, the anti-reflector RPP and the window WP may be replaced with other components or omitted.

In FIG. 2, among the input sensing layer ISL, the anti-reflector RPP, and the window WP, the input sensing layer ISL is formed together with the display panel DP through the continuous processes and disposed directly on the display panel DP. In the specification, "a component B is disposed directly on a component A" means that there is no separate adhesive layer/adhesive member between the component A and the component B. After the component A is formed, the component B is formed on a base surface provided by the component of A through continuous processes.

In the exemplary embodiment, the anti-reflector RPP and the window WP may be a "panel" type, and the input sensing layer ISL may be a "layer" type. The "panel" type includes a base layer, providing a base surface, such as a synthetic resin film, a composite material film, and a glass substrate, but the "layer" type may not have the base layer. That is, the "layer" type components are disposed on bottom surfaces provided by other components. In an exemplary embodiment of the inventive concepts, the anti-reflector RPP and the window WP may be the "layer" type.

The display panel DP generates an image, and the input sensing layer ISL acquires coordinate information about an external input (for example, a touch event). Although not illustrated separately, the display device DD according to an exemplary embodiment of the inventive concepts may further include a protective member disposed on a bottom surface of the display panel DP. The protective member and the display panel DP may be coupled to each other through the adhesive member.

The display panel DP according to the exemplary embodiment of the inventive concepts may be a light emitting-type display panel, but is not particularly limited thereto. For example, the display panel DP may be an organic light emitting display panel or a quantum-dot light emitting display panel. These panels may be classified according to a material constituting a light emitting element. A light emitting layer of the organic light emitting display panel may include an organic light emitting material. A light emitting layer of the quantum-dot light emitting display panel may include quantum dots and/or quantum rods. Hereinafter, the display panel DP is described as the organic light emitting display panel.

The anti-reflector RPP may reduce reflectivity of external light that is incident from an upper side of the window WP. The anti-reflector RPP according to an e exemplary embodiment of the inventive concepts may include a phase retarder and a polarizer. The phase retarder may be a film type or a liquid crystal coating type, and may include a $\lambda/2$ phase retarder and/or a $\lambda/4$ phase retarder. The polarizer may also be a film type or a liquid crystal coating type. The film type may include an elongated synthetic resin film, and the liquid crystal coating type may include liquid crystals arranged in a predetermined arrangement. The phase retarder and the polarizer may further include protective films. The phase retarder and the polarizer themselves or the protective films may be defined as a base layer of the anti-reflector RPP.

The anti-reflector RPP according to an exemplary embodiment of the inventive concepts may include color filters. The color filters have a predetermined arrangement. Considering light emission colors of pixels included in the display panel DP, the arrangement of the color filters may be determined. The anti-reflector RPP may further include a black matrix adjacent to the color filters.

The anti-reflector RPP according to an exemplary embodiment of the inventive concepts may include a destructive interference structure. For example, the destructive interference structure may include a first refection layer and a second refection layer which are disposed on different layers. First refection light and second refection light, which are reflected respectively from the first refection layer and the second refection layer, may be destructively interfered, and thus, the reflectivity of external light is reduced.

The window WP according to an exemplary embodiment of the inventive concepts may include a glass substrate and/or a synthetic resin film. The window WP is not limited to a single layer. The window WP may include two or more films coupled to each other through an adhesive member. Although not separately illustrated, the window WP may further include a functional coating layer. The functional coating layer may include an anti-fingerprint layer, an anti-reflection layer, and a hard coating layer.

Figure 3:
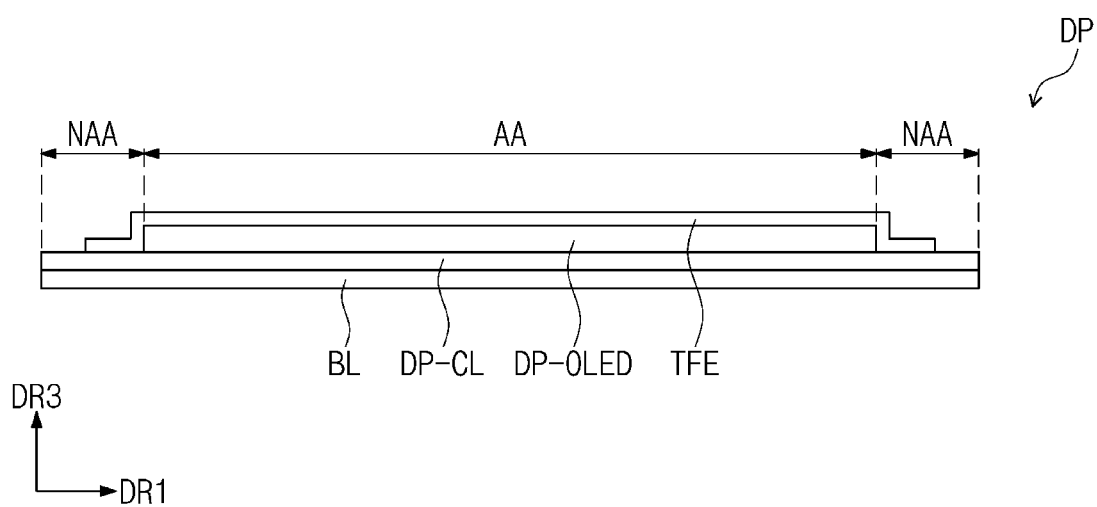
FIG. 3 is a cross-sectional view of the display panel illustrated in FIG. 2.

FIG. 3 is a cross-sectional view of the display panel DP illustrated in FIG. 2.

As illustrated in FIG. 3, the display panel DP includes a base layer BL, a circuit element layer DP-CL disposed on the base layer BL, a light emitting element layer DP-OLED, and a thin film encapsulation layer TFE. An active area AA and a peripheral area NAA respectively corresponding to the image area DD-DA and the bezel area DD-NDA illustrated in FIG. 1 may be defined in the display panel DP. In the specification, "a region/portion corresponds to another region/portion" means that "the regions/portions overlap each other", but is not limited to having the same surface area and/or having the same shape.

The base layer BL may include at least one synthetic resin film. The base layer BL may include a glass substrate, a metal substrate, an organic/inorganic composite material substrate, or the like.

The circuit element layer DP-CL is disposed on the base layer BL. The circuit element layer DP-CL includes at least one insulating layer and circuit elements. The insulating layer includes at least one inorganic layer and at least one organic layer. The circuit elements may include signal lines, a pixel driving circuit, or the like.

The light emitting element layer DP-OLED is disposed on the circuit element layer DP-CL. The light emitting element layer DP-OLED may include organic light emitting diodes as light emitting elements. The light emitting element layer DP-OLED may further include an organic layer such as a pixel definition layer.

The thin film encapsulation layer TFE may be disposed on the light emitting element layer DP-OLED to cover the light emitting element layer DP-OLED. The thin film encapsulation layer TFE may entirely cover an active area AA. The thin film encapsulation layer TFE may cover a portion of a peripheral area NAA.

The thin film encapsulation layer TFE includes thin films. Some thin films are disposed to improve optical efficiency, and other thin films are disposed to protect the organic light emitting diodes.

Figure 4:
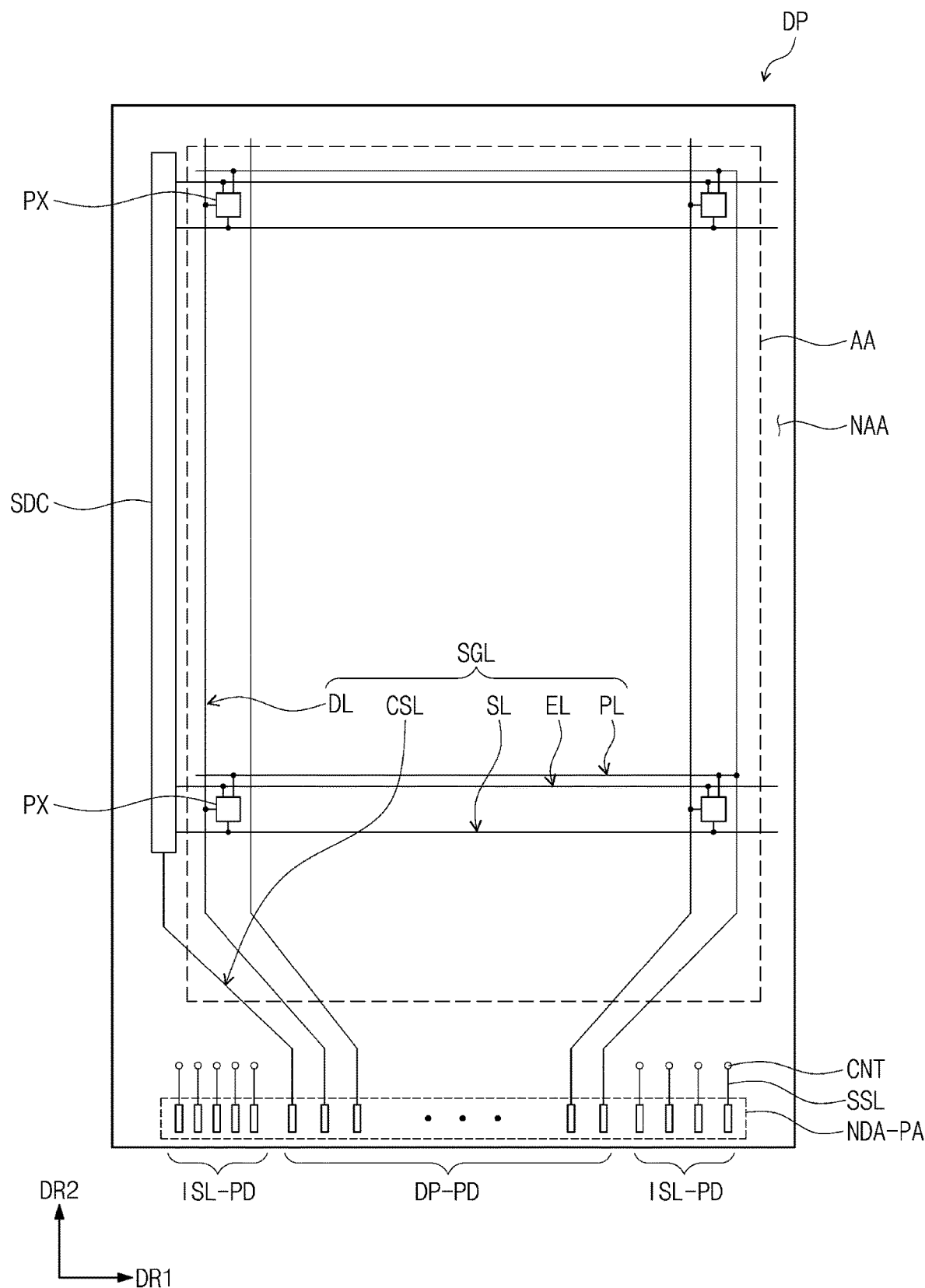
FIG. 4 is a plan view of a display panel according to an embodiment of the inventive concepts.

FIG. 4 is a plan view of a display device DP according to an embodiment of the inventive concepts.

As illustrated in FIG. 4, the display panel DP may include a scan driving circuit SDC, a plurality of signal lines SGL (hereinafter, referred to as the signal lines), a plurality of signal pads DP-PD and ISL-PD (hereinafter, referred to as the signal pads), and a plurality of pixels PX (hereinafter, referred to as the pixels).

The scan driving circuit SDC generates a plurality of scan signals (hereinafter, referred to as the scan signals) and sequentially outputs the scan signals to a plurality of scan lines SL (hereinafter, referred to as the scan lines) which will be described later. The scan driving circuit SDC may output to the pixels PX other control signals as well as the scan signals.

The scan driving circuit SDC may include a plurality of transistors which are formed through the same process as transistors in the pixels PX.

The signal lines SGL include scan lines SL, data lines DL, a power line PL, light emission control lines EL, and a control signal line CSL. Each of the scan lines SL, the data lines DL, and the light emission control lines EL is connected to a corresponding pixel PX among the pixels PX. The power line PL is connected to the pixels PX in common. The control signal line CSL may provide the scan driving circuit SDC with control signals. The power line PL may provide a voltage required for operations of the pixels PX. The power line PL may include a plurality of lines that provide different voltages.

In the exemplary embodiment, the signal lines SGL may further include auxiliary lines SSL. The auxiliary lines SSL may be signal lines connected to the input sensing layer ISL (see FIG. 2). In an embodiment of the inventive concepts, the auxiliary lines SSL may be omitted. The auxiliary lines SSL may be connected to contact holes CNT, respectively. The auxiliary lines SSL may be connected to signal lines of the input sensing layer ISL (see FIG. 6) which will be described later through the contact holes CNT.

The signal pads DP-PD and ISL-PD may include first-type signal pads DP-PD connected to the data lines DL, the power line PL, and the control signal line CSL, and second-type signal pads ISL-PD connected to the auxiliary lines SSL. The first-type signal pads DP-PD and the second-type signal pads ISL-PD are disposed adjacent to each other in a pad area NDA-PA which is defined in a portion of a peripheral area NAA. Stack structures or constituents of the signal pads DP-PD, ISL-PD may be not distinguished from each other but formed through the same process.

An active area AA may be defined as an area in which the pixels PX are disposed. In the active area AA, a plurality of electronic elements are disposed. The electronic elements include an organic light emitting diode provided in each of the pixels PX and a pixel driving circuit connected thereto. The scan driving circuit SDC, the signal lines SGL, the signal pads DP-PD and ISL-PD, the pixel driving circuit may be included in the circuit element layer DP-CL illustrated in FIG. 3.

Although not shown in the drawing, each of the pixel PX may include a plurality of transistors, a capacitor, and an organic light emitting diode. The pixels PX emit light in response to signals received through the scan lines SL, the data lines DL, the light emission control lines EL, and the power line PL.

The signal pads DP-PD and ILS-PD of the display panel DP may be electrically connected to a printed circuit board which is not shown in the drawing.

A portion of the display panel DP illustrated in FIG. 4 may be bent. A portion of the peripheral area NAA of the display panel DP may be bent. The portion may be bent with respect to a bending axis parallel to a first direction DR1. The bending axis may be defined as overlapping some of the data lines DL and some of the auxiliary lines SSL.

Figure 5:
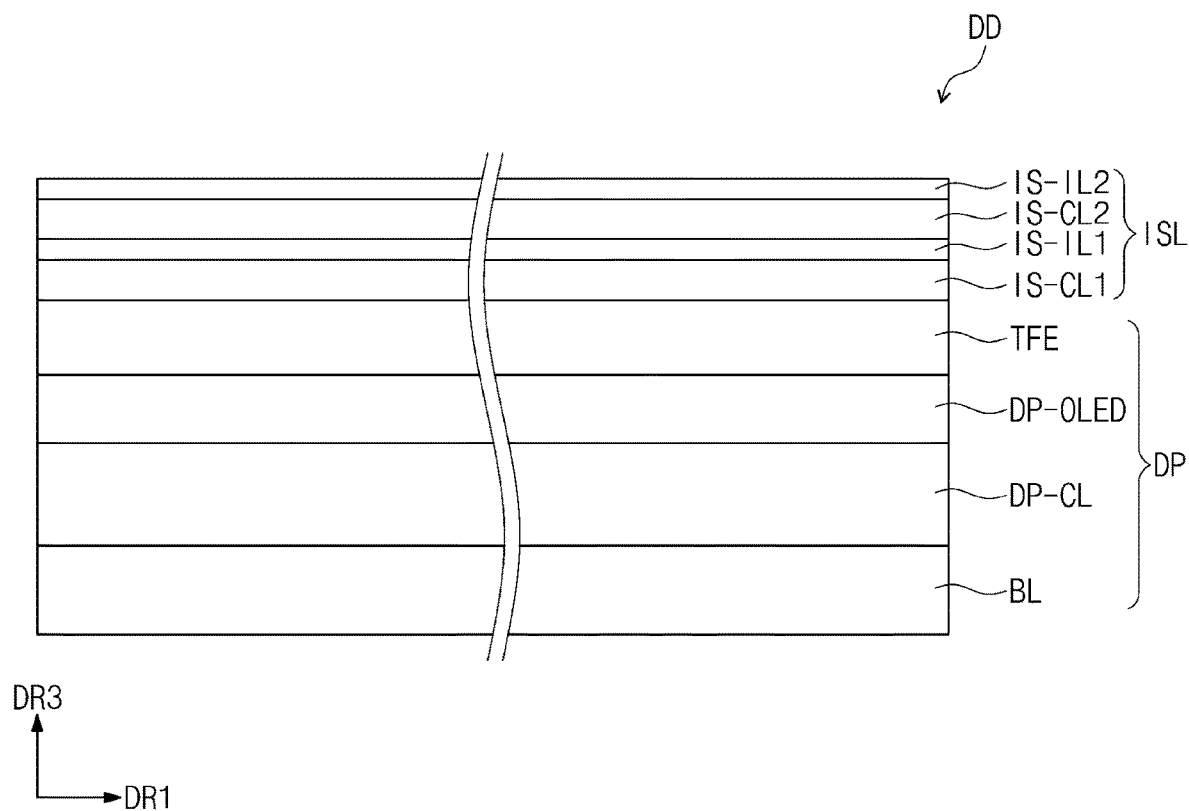
FIG. 5 is a cross-sectional view of a display panel and an input sensing layer of a display device according to an embodiment of the inventive concepts.

FIG. 5 is a cross-sectional view of a display panel DP and an input sensing layer ISL of a display device DD according to an embodiment of the inventive concepts. The display panel DP is schematically illustrated to explain a stacked relationship of the input sensing layer ISL. The anti-reflector RPP (see FIG. 2) and the window WP (see FIG. 2) which may be disposed on the input sensing layer ISL are not illustrated.

As illustrated in FIG. 5, the display panel DP include a base layer BL, a circuit element layer DP-CL, a light emitting element layer DP-OLED, and a thin film encapsulation layer TFE. The input sensing layer ISL may be disposed on the thin film encapsulation TFE.

The input sensing layer ISL may include a first conductive layer IS-CL1, a first insulating layer IS-IL1, a second conductive layer IS-CL2, and a second insulating layer IS-IL2. The first conductive layer IS-CL1 is disposed directly on the thin film encapsulation layer TFE. In another embodiment, an insulating layer may be additionally disposed between the thin film encapsulation layer TFE and the first conductive layer IS-CL1.

Each of the first conductive layer IS-CL1 and the second conductive layer IS-CL2 may have a single-layered structure or a multi-layered structure in which layers are stacked in a third direction axis DR3. The conductive layer having the multi-layered structure may include at least two or more layers of transparent conductive layers and metal layers. The conductive layer having the multi-layered structure may include metal layers having different metals. Each of the transparent conductive layers may include indium tin oxide (ITO), indium zinc oxide (IZO), zinc oxide (ZnO), indium tin zinc oxide (ITZO), PEDOT, a metal nano wire, and graphene. Each of the metal layers may include molybdenum, silver, titanium, copper, aluminum, and an alloy thereof. For example, each of the first conductive layer IS-CL1 and the second conductive layer IS-CL2 may have a three-layered metal structure, such as, a three-layered structure of titanium/aluminum/titanium. A metal having relatively higher durability and lower reflectivity may be applied to an outer layer, and a metal having higher electrical conductivity may be applied to an inner layer.

Each of the first conductive layer IS-CL1 and the second conductive layer IS-CL2 include a plurality of conductive patterns. Hereinafter, the first conductive layer IS-CL1 is described to include first conductive patterns, and the second conductive layer IS-CL2 is described to include second conductive patterns. Each of the first conductive patterns and the second conductive patterns may include sensing electrodes and sensing lines connected thereto.

Each of the first insulating layer IS-IL1 and the second insulating layer IS-IL2 may include an inorganic layer or an organic layer. In the embodiment, each of the first insulating layer IS-IL1 and the second insulating layer IS-IL2 may be an inorganic layer. The inorganic layer may include at least one of an aluminum oxide, a titanium oxide, a silicon oxide, a silicon oxynitride, a zirconium oxide, or a hafnium oxide. In another embodiment, the second insulating layer IS-IL2 may include an organic layer. The organic layer may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

Figure 6:
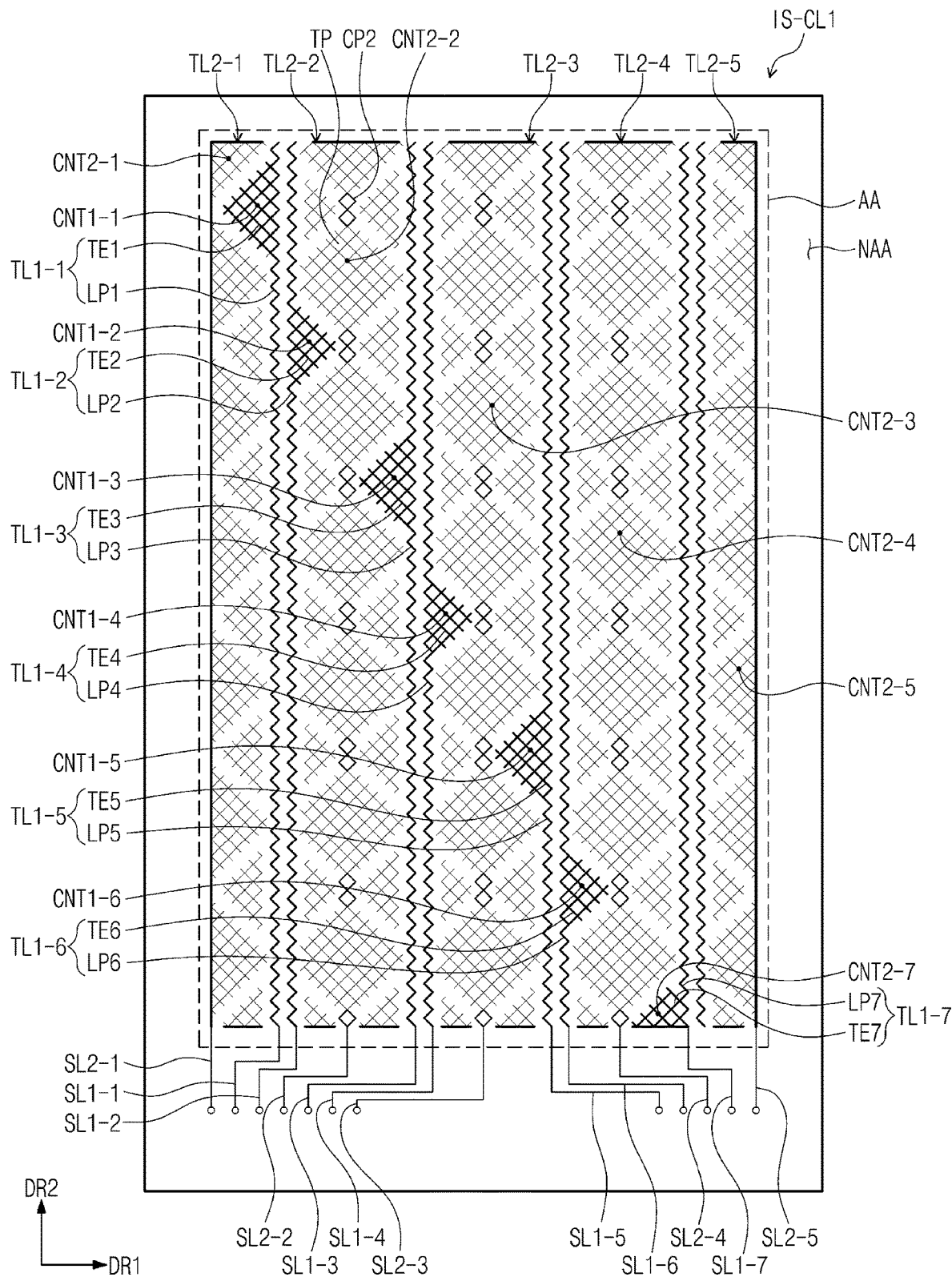
FIG. 6 is a plan view of a first conductive layer of an input sensing layer according to an embodiment of the inventive concepts.
Figure 7:
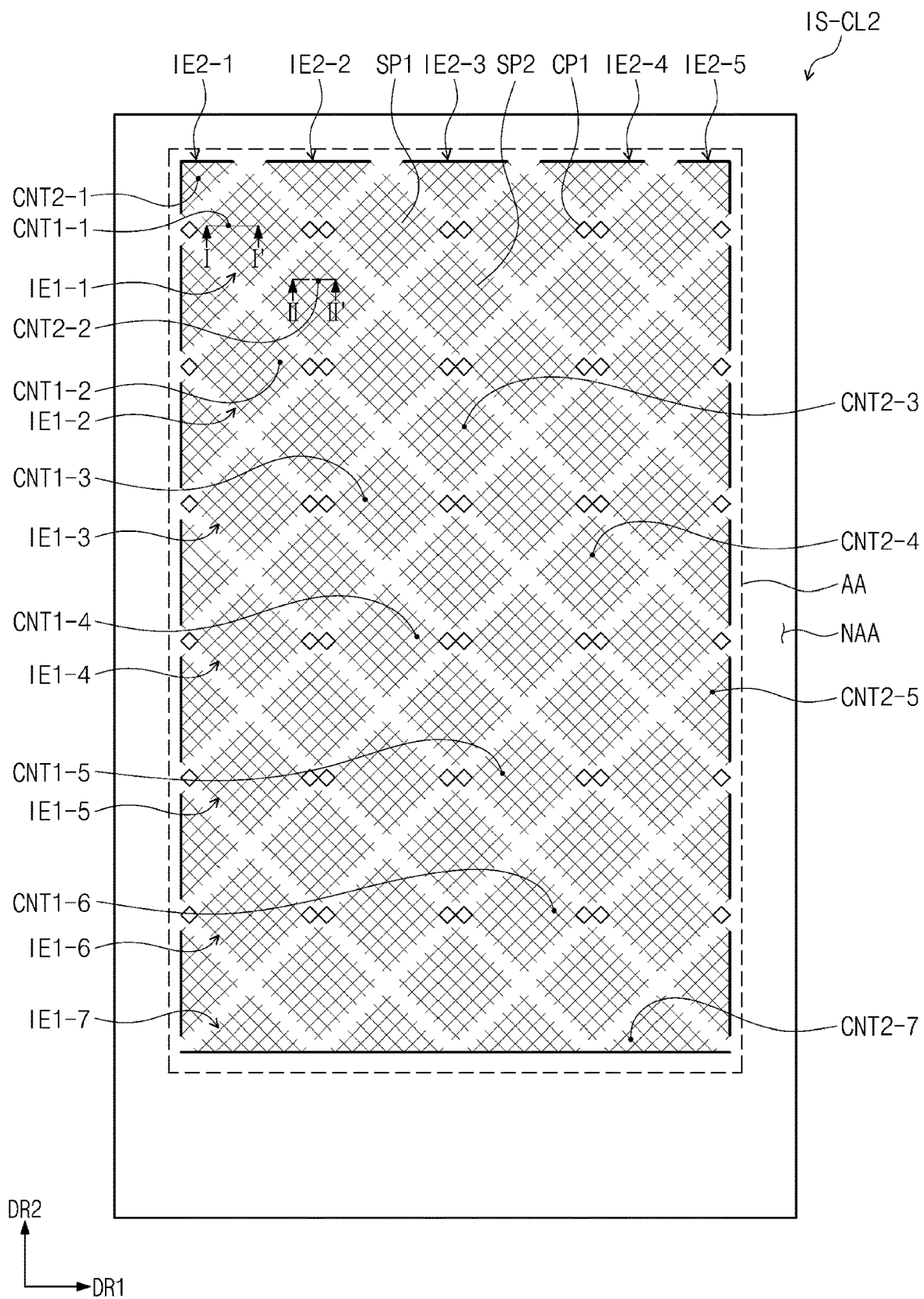
FIG. 7 is a plan view of a second conductive layer of an input sensing layer according to an embodiment of the inventive concepts.

FIG. 6 is a plan view of a first conductive layer IS-CL1 of an input sensing layer ISL according to an embodiment of the inventive concepts. FIG. 7 is a plan view of a second conductive layer IS-CL2 of the input sensing layer ISL according to an embodiment of the inventive concepts.

Referring to FIG. 6, the first conductive layer IS-CL1 of the input sensing layer ISL include first trace lines TL1-1 to TL1-7, second trace lines TL2-1 to TL2-5, first signal lines SL1-1 to SL1-7, and second signal lines SL2-1 to SL2-5. In another embodiment, the first signal lines SL1-1 to SL1-7 and the second signal lines SL2-1 to SL2-5 may be disposed in the second conductive layer IS-CL2.

The input sensing layer ISL may overlap the entire display panel DP (see FIG. 4). However, in another exemplary embodiment of the inventive concepts, the input sensing layer ISL may overlap only a portion of the active area AA of the display panel DP or only the peripheral area NAA.

In the exemplary embodiment of the inventive concepts, the input sensing layer ISL includes an active area AA and a peripheral area NAA which correspond to the image area DD-DA (see FIG. 1) and the bezel area DD-NDA (see FIG. 1), respectively. The active area AA and the peripheral area NAA of the input sensing layer ISL respectively correspond to the active area AA and the peripheral area NAA of the display panel DP (see FIG. 4). Thus, the same reference symbols are given thereto. The active area AA of the input sensing layer ISL may be defined as an area in which first sensor portions SP1 and second sensor portions SP2 of the second conductive layer IS-CL2 illustrated in FIG. 7 are disposed. Also, in an embodiment of the inventive concepts, the first trace lines TL1-1 to TL1-7 and the second trace lines TL2-1 to TL2-5 of the first conductive layer IS-CL1 may be disposed in the active area AA of the input sensing layer ISL while overlapping the first sensor portions SP1 and second sensor portions SP2 of the second conductive layer IS-CL2. The first signal lines SL1-1 to SL1-7 and the second signal lines SL2-1 to SL2-5 of the first conductive layer IS-CL1 are disposed in the peripheral area NAA. The first signal lines SL1-1 to SL1-7 and the second signal lines SL2-1 to SL2-5 are connected to the contact holes CNT, respectively. The first signal lines SL1-1 to SL1-7 and the second signal lines SL2-1 to SL2-5 may be electrically connected to the second-type signal pads ISL-PD via the contact holes CNT and the auxiliary lines SSL illustrated in FIG. 4.

The first trace lines TL1-1 to TL1-7 are disposed apart from each other in a first direction DR1 while each extends in a second direction DR2. The first trace lines TL1-1 to TL1-7 are lines which are not electrically connected to but insulated from each other. Ends of the first trace lines TL1-1 to TL1-7 are connected to the first signal lines SL1-1 to SL1-7, respectively.

The first trace line TL1-1 includes a trace electrode TE1 and a line portion LP1 which are electrically connected to each other. The trace electrode TE1 has a polygonal mesh shape. The line portion LP1 has a shape extending in the second direction DR2.

The first trace line TL1-2 includes a trace electrode TE2 and a line portion LP2 which are electrically connected to each other. The trace electrode TE2 has a polygonal mesh shape. The line portion LP2 has a shape extending in the second direction DR2.

The line portion LP1 and the line portion LP2 are disposed adjacent to each other. The trace electrode TE1 is positioned on the left side of the line portion LP1, and the trace electrode TE2 is positioned on the right side of the line portion LP2.

The first trace line TL1-3 includes a trace electrode TE3 and a line portion LP3 which are electrically connected to each other. The trace electrode TE3 has a polygonal mesh shape. The line portion LP3 has a shape extending in the second direction DR2.

The first trace line TL1-4 includes a trace electrode TE4 and a line portion LP4 which are electrically connected to each other. The trace electrode TE4 has a polygonal mesh shape. The line portion LP4 has a shape extending in the second direction DR2.

The line portion LP3 and the line portion LP4 are disposed adjacent to each other. The trace electrode TE3 is positioned on the left side of the line portion LP3, and the trace electrode TE4 is positioned on the right side of the line portion LP4.

The first trace line TL1-5 includes a trace electrode TE5 and a line portion LP5 which are electrically connected to each other. The trace electrode TE5 has a polygonal mesh shape. The line portion LP5 has a shape extending in the second direction DR2.

The first trace line TL1-6 includes a trace electrode TE6 and a line portion LP6 which are electrically connected to each other. The trace electrode TE6 has a polygonal mesh shape. The line portion LP6 has a shape extending in the second direction DR2.

The line portion LP5 and the line portion LP6 are disposed adjacent to each other. The trace electrode TE5 is positioned on the left side of the line portion LP5, and the trace electrode TE6 is positioned on the right side of the line portion LP6.

The first trace line TL1-7 includes a trace electrode TE7 and a line portion LP7 which are electrically connected to each other. The trace electrode TE7 has a polygonal mesh shape. The line portion LP7 has a shape extending in the second direction DR2.

The trace electrodes TE1 to TE7 may be disposed in different rows in the second direction DR2.

The second trace lines TL2-1 to TL2-5 are disposed apart from each other in the first direction DR1 while each extends in the second direction DR2. The second trace lines TL2-1 to TL2-5 are lines which are not electrically connected to but insulated from each other. The first trace lines TL1-1 to TL1-7 and the second trace lines TL2-1 to TL2-5 are insulated from each other. Ends of the second trace lines TL2-1 to TL2-5 are connected to the second signal lines SL2-1 to SL2-5, respectively.

Each of the second trace lines TL2-1 to TL2-5 includes trace portions TP and second connection portions CP2. The trace portions TP may be connected to each other in the second direction DR2 by the second connection portions CP2. Each of the trace portions TP may have a polygonal (for example, rhombic) mesh shape and include a metal to improve flexibility.

In an example illustrated in FIG. 6, two of the first trace lines TL1-1 to TL1-7 and one of the second trace lines TL2-1 to TL2-5 are alternately disposed in the first direction DR1.

In FIG. 6, the first trace lines TL1-1 to TL1-7 and the second connection portions CP2 are shown as thick lines so as to be easily distinguished from other lines. The first trace lines TL1-1 to TL1-7, the second trace lines TL2-1 to TL2-5, the first signal lines SL1-1 to SL1-7, and the second signal lines SL2-1 to SL2-5 may have the same line width and thickness. In another embodiment, some of the first trace lines TL1-1 to TL1-7, the second trace lines TL2-1 to TL2-5, the first signal lines SL1-1 to SL1-7, and the second signal lines SL2-1 to SL2-5 may have different line widths and/or thicknesses from other lines.

As illustrated in FIG. 7, the second conductive layer IS-CL2 of the input sensing layer ISL include first sensing electrodes IE1-1 to IE1-7 and second sensing electrodes IE2-1 to IE2-5.

The first sensing electrodes IE1-1 to IE1-7 extend in a first direction DR1 and are disposed apart from each other in a second direction DR2. The first sensing electrodes IE1-1 to IE1-7 are insulated from each other.

Each of the first sensing electrodes IE1-1 to IE1-7 includes first sensor portions SP1 and first connection portions CP1. Each of the first sensor portions SP1 may have a polygonal (for example, rhombic) mesh shape and include a metal to improve flexibility. The sensor portions SP1 of each of the first sensing electrodes IE1-1 to IE1-7 may be connected to each other through the first connection portions CP1.

Each of the second sensing electrodes IE2-1 to IE2-5 includes second sensor portions SP2 disposed apart from each other in the second direction DR2. The second sensing electrodes IE2-1 to IE2-5 are disposed apart from each other in the first direction DR1. That is, the second sensor portions SP2 of the second sensing electrodes IE2-1 to IE2-5 are disposed apart from each other in the first direction DR1 and the second direction DR2. Each of the second sensor portions SP2 may have a polygonal (for example, rhombic) mesh shape and include a metal to improve flexibility.

Each of the first sensor portions SP1 of the first sensing electrode IE1-7 has a small size and, for example, may be half the size of each of the first sensor portions SP1 of the first sensing electrode IE1-1 to IE1-6. For the second sensor portions SP2, each of the second sensor portions SP2 of the second sensing electrode IE2-1 and IE2-5 and the second sensor portions SP2 disposed on ends of the second sensing electrodes IE2-2 to IE2-4 has a small size and, for example, may be half the size of each of the other second sensor portions SP2.

Referring to FIGS. 6 and 7, the first trace lines TL1-1 to TL1-7 of the first conductive layer IS-CL1 are connected to the first sensing electrodes IE1-1 to IE1-7 of the second conductive layer IS-CL2, respectively. In particular, the trace electrode TE1 of the first trace line TL1-1 is connected to the first sensing electrode IE1-1 via a first contact hole CNT1-1. The trace electrode TE2 of the first trace line TL1-2 is connected to the first sensing electrode IE1-2 via a first contact hole CNT1-2. The trace electrode TE3 of the first trace line TL1-3 is connected to the first sensing electrode IE1-3 via a first contact hole CNT1-3. The trace electrode TE4 of the first trace line TL1-4 is connected to the first sensing electrode IE1-4 via a first contact hole CNT1-4. The trace electrode TE5 of the first trace line TL1-5 is connected to the first sensing electrode IE1-5 via a first contact hole CNT1-5. The trace electrode TE6 of the first trace line TL1-6 is connected to the first sensing electrode IE1-6 via a first contact hole CNT1-6. The trace electrode TE7 of the first trace line TL1-7 is connected to the first sensing electrode IE1-7 via a first contact hole CNT1-7.

Each of the trace electrodes TE1 to TE7 has a small size and, for example, may be half the size of each of the first sensing electrodes IE1-1 to IE1-7.

The second trace lines TL2-1 to TL2-5 of the first conductive layer IS-CL1 are connected to the second sensing electrodes IE2-1 to IE2-5 of the second conductive layer IS-CL2, respectively. In particular, the second trace line TL2-1 is connected to the second sensing electrode IE2-1 via a second contact hole CNT2-1. The second trace line TL2-2 is connected to the second sensing electrode IE2-2 via a second contact hole CNT2-2. The second trace line TL2-3 is connected to the second sensing electrode IE2-3 via a second contact hole CNT2-3. The second trace line TL2-4 is connected to the second sensing electrode IE2-4 via a second contact hole CNT2-4. The second trace line TL2-5 is connected to the second sensing electrode IE2-5 via a second contact hole CNT2-5.

When a driving signal (or a transmission (TX) signal) for detecting an external input is transmitted to the second sensing electrodes IE2-1 to IE2-5 via the second signal lines SL2-1 to SL2-5 and the second trace lines TL2-1 to TL2-5, the first sensing electrode IE1-1 is capacitively coupled to the second sensing electrodes IE2-1 to IE2-5. When the input TC (see FIG. 1) of the user is applied on the specific second sensing electrode of the second sensing electrodes IE2-1 to IE2-5 which are capacitively coupled, capacity between the first sensing electrode IE1-1 and the second sensing electrode changes. The change in capacity between the first sensing electrode IE1-1 and the second sensing electrode may be transmitted as a sensing signal (or a reception (RX) signal) to the first signal line SL1-1 via the first trace line TL1-1.

Using the method described above, the changes in capacity between the first sensing electrodes IE1-1 to IE1-7 and the second sensing electrodes IE2-1 to IE2-5 are sequentially sensed, and thus, the display device DD may acquire coordinate information about the input TC of the user.

In an exemplary embodiment, the second sensing electrodes IE2-1 to IE2-5 are TX electrodes for transmitting transmission (TX) signals, and the first sensing electrodes IE1-1 to IE1-7 are RX electrodes for transmitting reception (RX) signals. However, the embodiment is not limited thereto. For example, the first sensing electrodes IE1-1 to IE1-7 may be the TX electrodes, and the second sensing electrodes IE2-1 to IE2-5 may be the RX electrodes.

Figure 8A:
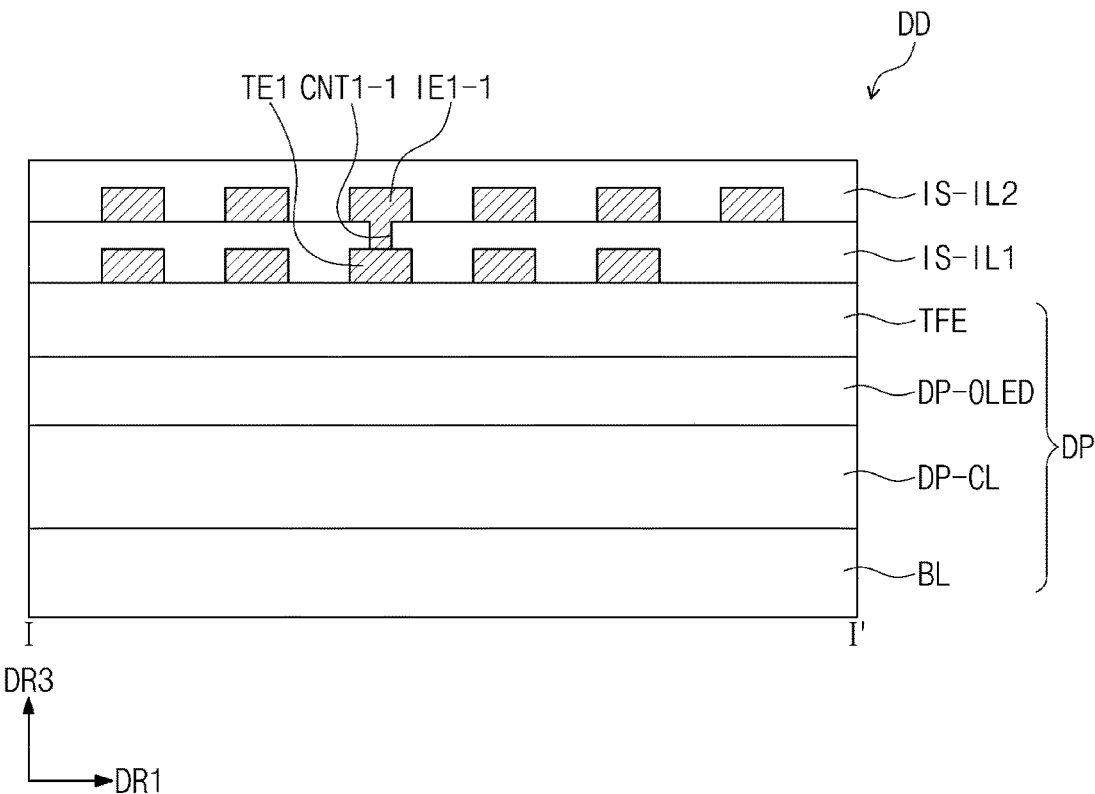
FIG. 8A is a cross-sectional view taken along line I-I' of FIG. 7.

FIG. 8A is a cross-sectional view taken along line I-I' of FIG. 7.

Referring to FIG. 8A, the first sensing electrode IE1-1 may be electrically connected to a first trace electrode TE1 via the first contact hole CNT1-1.

In the embodiment, the first insulating layer IS-IL1 may be a polymer layer, for example, an acrylic polymer layer. The second insulating layer IS-IL2 may also be a polymer layer, for example, an acrylic polymer layer. In the cross-sectional view, the first sensing electrode IE1-1 having the mesh shape may include electrode patterns which are disposed a predetermined distance apart from each other in the first direction DR1. In the cross-sectional view, the first trace electrode TE1 having the mesh shape may include electrode patterns which are disposed a predetermined distance apart from each other in the first direction DR1. The electrode patterns of the first sensing electrode IE1-1 and the electrode patterns of the first trace electrode TE1 may overlap each other in a plan view.

In FIG. 8A, the connection between the first sensing electrode IE1-1 and the first trace electrode TE1 are illustratively shown. The connections between the first sensing electrodes IE1-2 to IE1-7 and the trace electrodes TE2 to TE7 may also be the same as the connection illustrated in FIG. 8A.

Figure 8B:
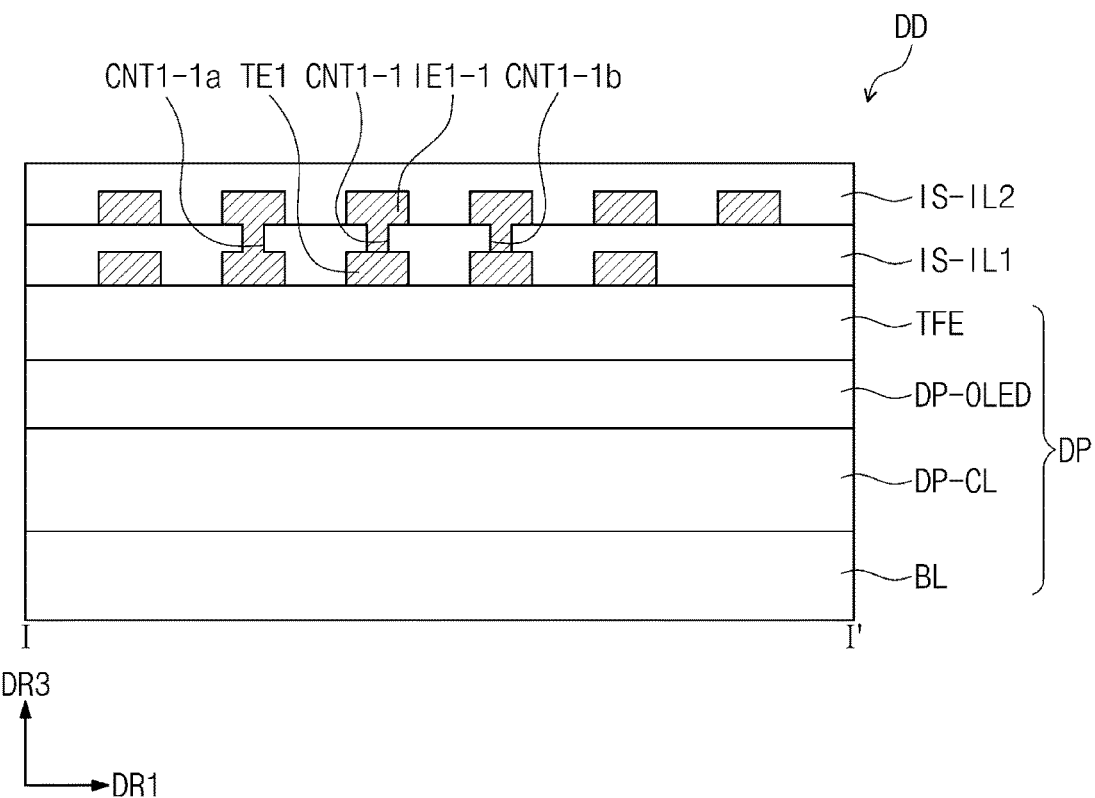
FIG. 8B is another example of a cross-sectional view taken along line I-I' of FIG. 7.

FIG. 8B is another example of a cross-sectional view taken along line I-I' of FIG. 7.

Referring to FIG. 8B, the electrode patterns of the first sensing electrode IE1-1 and the electrode patterns of the first trace electrode TE1 may be electrically connected to each other via not only the first contact hole CNT1-1 but also first contact holes CNT1-1a and CNT1-1b.

As illustrated in FIGS. 8A and 8B, the number of the first contact holes for connecting the first sensing electrode IE1-1 and the first trace electrode TE1 may be one or more.

Figure 9A:
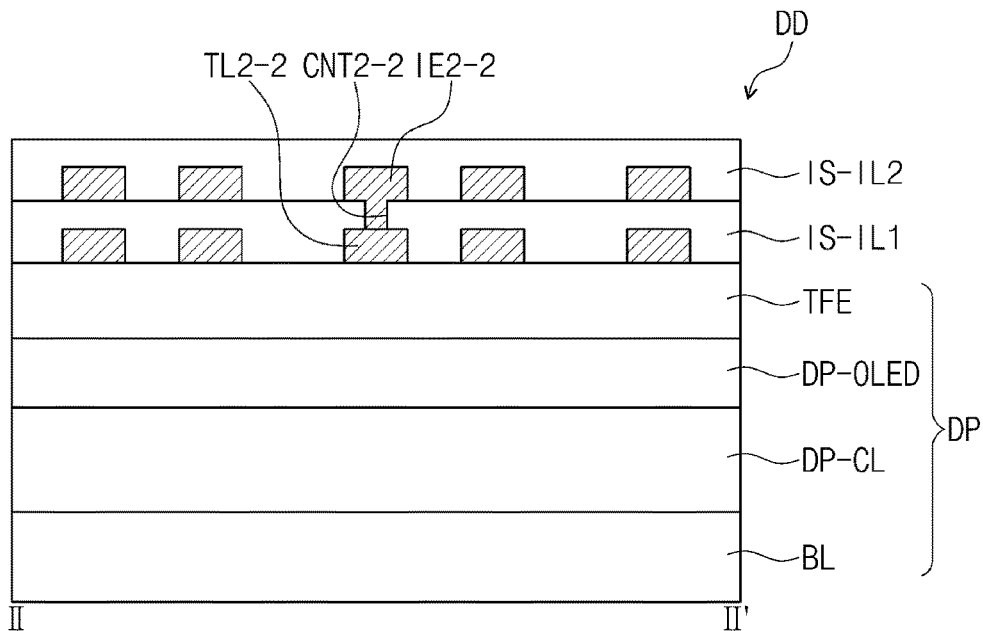
FIG. 9A is a cross-sectional view taken along the line II-II' of FIG. 7.

FIG. 9A is a cross-sectional view taken along the line II-II' of FIG. 7.

Referring to FIG. 9A, the second sensing electrode IE2-2 may be electrically connected to the second trace line TL2-2 via the second contact hole CNT2-2.

In the cross-sectional view, the second sensing electrode IE2-2 having the mesh shape may include electrode patterns which are disposed a predetermined distance apart from each other in the first direction DR1. In the cross-sectional view, the second trace line TL2-2 having the mesh shape may include electrode patterns which are disposed a predetermined distance apart from each other in the first direction DR1. The electrode patterns of the second sensing electrode IE2-2 and the electrode patterns of the second trace line TL2-2 may overlap each other in a plan view.

In FIG. 9A, the connection between the second sensing electrode IE2-2 and the second trace line TL2-2 are illustratively shown. The connections between the second sensing electrodes IE2-1 and IE2-3 to IE2-5 and the second trace lines TL2-1 and TL2-3 to TL2-5 may also be the same as the connection illustrated in FIG. 9A.

Figure 9B:
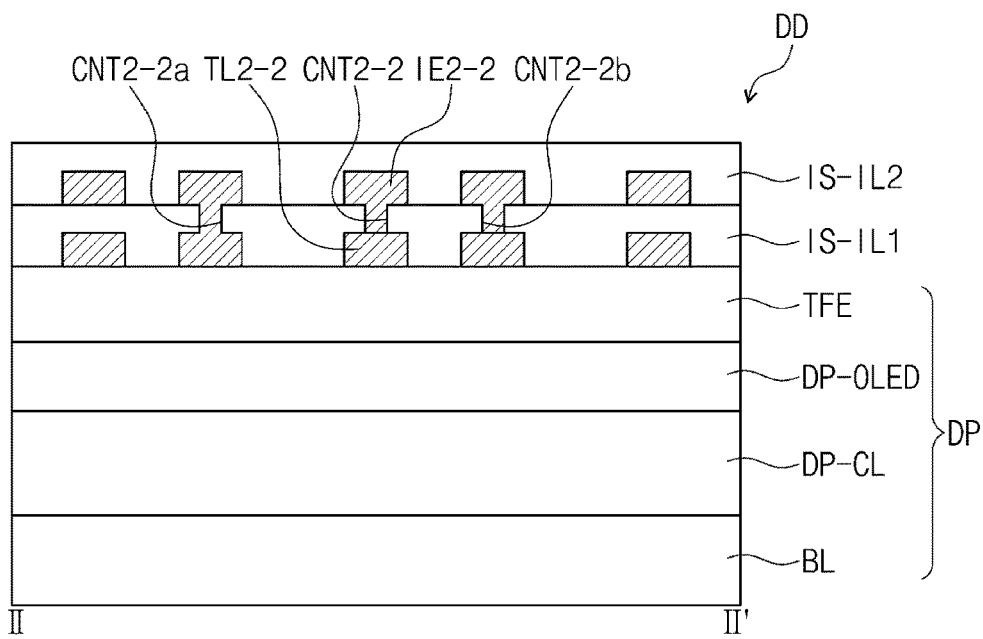
FIG. 9B is another example of a cross-sectional view taken along line II-II' of FIG. 7.

FIG. 9B is another example of a cross-sectional view taken along line of FIG. 7.

Referring to FIG. 9B, the electrode patterns of the second sensing electrode IE2-2 and the electrode patterns of the second trace line TL2-2 may be electrically connected to each other via not only the second contact hole CNT2-2 but also second contact holes CNT2-2a and CNT2-2b.

As illustrated in FIGS. 9A and 9B, the number of the second contact holes for connecting the second sensing electrode IE2-2 and the second trace line TL2-2 may be one or more.

As described above, in the input sensing layer ISL according to the embodiment of the inventive concepts, the first sensing electrodes IE1-1 to IE1-7 and the second sensing electrodes IE2-1 to IE2-5 are disposed in the second conductive layer IS-CL2, and the first trace lines TL1-1 to TL1-7 for connecting the first sensing electrodes IE1-1 to IE1-7 and the first signal lines SL1-1 to SL1-7 and the second trace lines TL2-1 to TL2-5 for connecting the second sensing electrodes IE2-1 to IE2-5 and the second signal lines SL2-1 to SL2-5 are disposed in the second conductive layer IS-CL2. Particularly, the first trace lines TL1-1 to TL1-7 and the second trace lines TL2-1 to TL2-5 are disposed in the active area AA, and thus, the peripheral area NAA may be minimized. Accordingly, the bezel area DD-NDA of the display device DD (see FIG. 1) may be minimized. The lengths of the first trace lines TL1-1 to TL1-7 in the second direction DR2 may be equal to each other so as to minimize a difference in touch sensitivity (or a noise difference) between the first trace lines TL1-1 to TL1-7. Also, the lengths of the second trace lines TL2-1 to TL1-5 in the second direction DR2 may be equal to each other so as to minimize a difference in touch sensitivity (or a noise difference) between the second trace lines TL2-1 to TL1-5. The difference in touch sensitivity occurring even though the lengths of the first trace lines TL1-1 to TL1-7 in the second direction DR2 are equal to each other may be minimized by adjusting line widths and/or thicknesses of the first trace lines TL1-1 to TL1-7. The difference in touch sensitivity occurring even though the lengths of the second trace lines TL2-1 to TL1-5 in the second direction DR2 are equal to each other may be minimized by adjusting line widths and/or thicknesses of the second trace lines TL2-1 to TL1-5.

Figure 10:
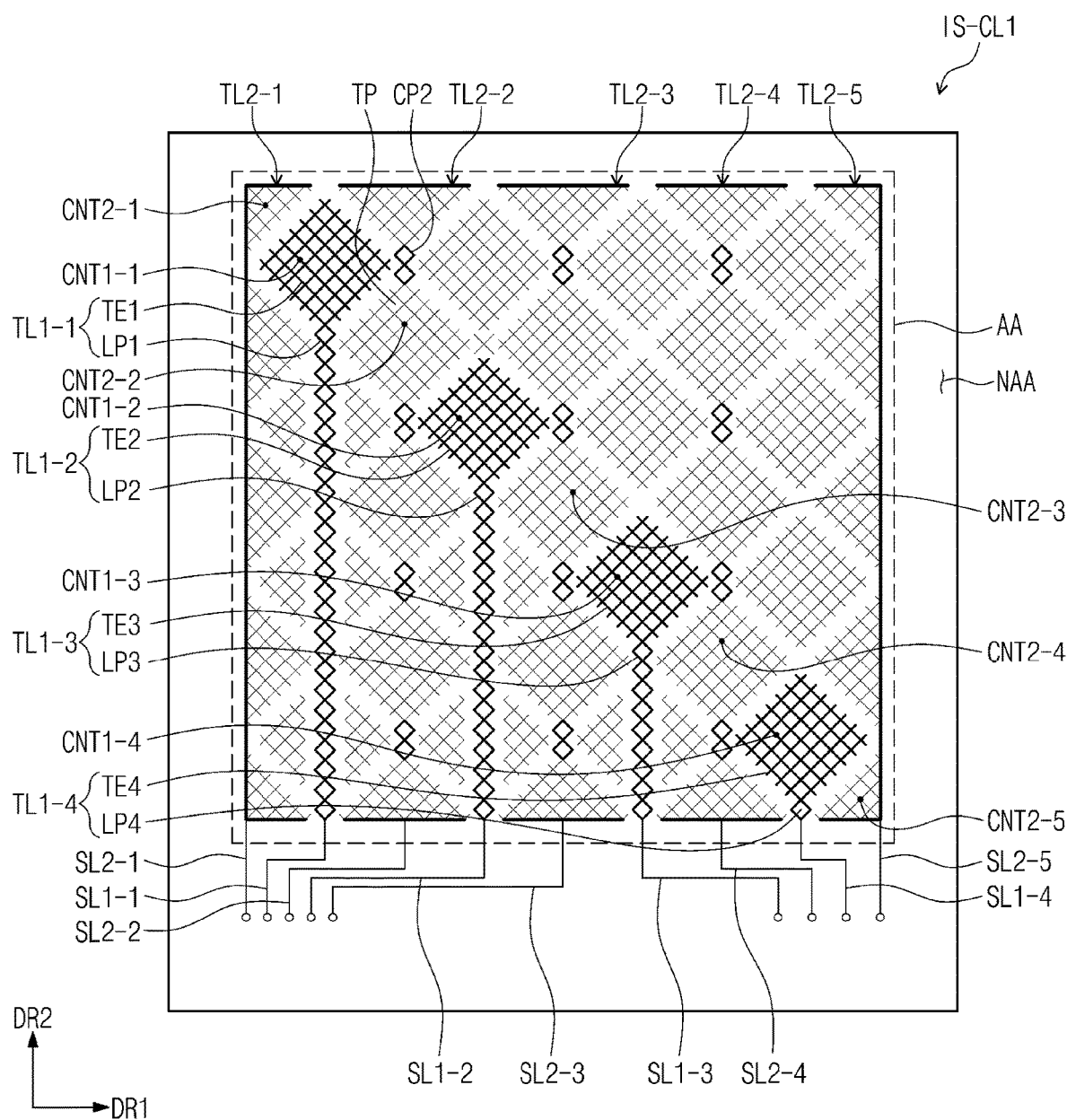
FIG. 10 is a plan view of a first conductive layer of an input sensing layer according to another embodiment of the inventive concepts.
Figure 11:
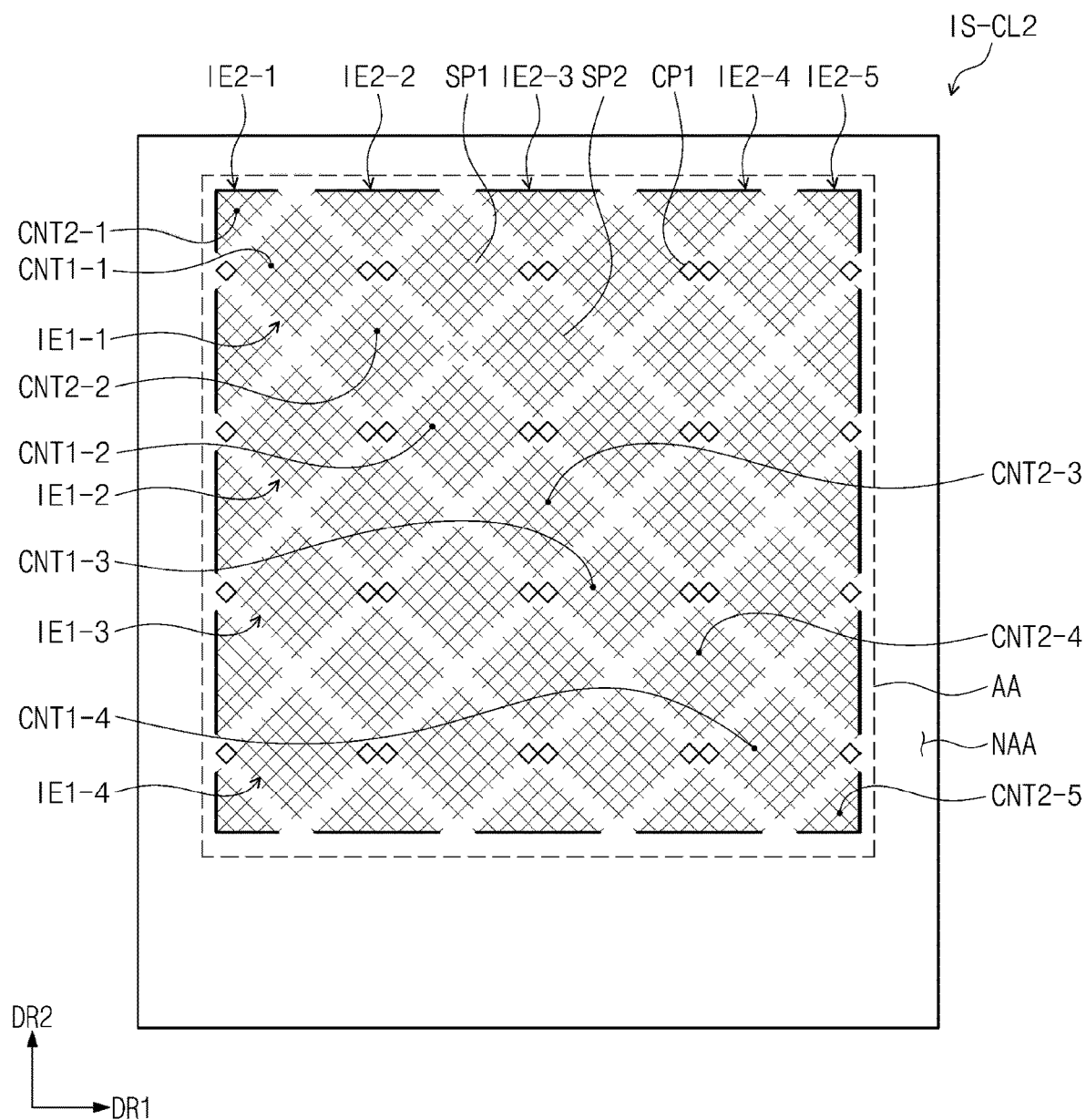
FIG. 11 is a plan view of a second conductive layer of an input sensing layer according to another embodiment of the inventive concepts.

FIG. 10 is a plan view of a first conductive layer IS-CL1 of an input sensing layer ISL according to another embodiment of the inventive concepts. FIG. 11 is a plan view of a second conductive layer IS-CL2 of the input sensing layer ISL according to another embodiment of the inventive concepts.

Referring to FIG. 10, the first conductive layer IS-CL1 of the input sensing layer ISL include first trace lines TL1-1 to TL1-4, second trace lines TL2-1 to TL2-5, first signal lines SL1-1 to SL1-4, and second signal lines SL2-1 to SL2-5.

The first trace lines TL1-1 to TL1-4 are disposed apart from each other in a first direction DR1 while each extends in a second direction DR2. The first trace lines TL1-1 to TL1-4 are lines which are not electrically connected to but insulated from each other. Ends of the first trace lines TL1-1 to TL1-4 are connected to the first signal lines SL1-1 to SL1-4, respectively.

The first trace line TL1-1 includes a trace electrode TE1 and a line portion LP1 which are electrically connected to each other. The first trace line TL1-2 includes a trace electrode TE2 and a line portion LP2 which are electrically connected to each other. The first trace line TL1-3 includes a trace electrode TE3 and a line portion LP3 which are electrically connected to each other. The first trace line TL1-4 includes a trace electrode TE4 and a line portion LP4 which are electrically connected to each other.

Each of the trace electrodes TE1 to TE4 has a polygonal mesh shape. The line portions LP1 to LP4 are respectively connected to the trace electrodes TE1 to TE4 and have a shape extending in the second direction DR2.

The second trace lines TL2-1 to TL2-5 are disposed apart from each other in the first direction DR1 while each extends in the second direction DR2. The second trace lines TL2-1 to TL2-5 are lines which are not electrically connected to but insulated from each other. The first trace lines TL1-1 to TL1-4 and the second trace lines TL2-1 to TL2-5 are insulated from each other. Ends of the second trace lines TL2-1 to TL2-5 are connected to the second signal lines SL2-1 to SL2-5, respectively.

Each of the second trace lines TL2-1 to TL2-5 includes trace portions TP and second connection portions CP2. The trace portions TP may be connected to each other in the second direction DR2 by the second connection portions CP2. Each of the trace portions TP may have a polygonal (for example, rhombic) mesh shape and include a metal to improve flexibility.

As illustrated in FIG. 11, the second conductive layer IS-CL2 of the input sensing layer ISL include first sensing electrodes IE1-1 to IE1-4 and second sensing electrode IE2-1 to IE2-5.

The first sensing electrodes IE1-1 to IE1-4 extend in a first direction DR1 and are disposed apart from each other in a second direction DR2. The first sensing electrodes IE1-1 to IE1-4 are insulated from each other.

Each of the first sensing electrodes IE1-1 to IE1-4 includes first sensor portions SP1 and first connection portions CP1. Each of the first sensor portions SP1 may have a polygonal (for example, rhombic) mesh shape and include a metal to improve flexibility. The sensor portions SP1 of each of the first sensing electrodes IE1-1 to IE1-4 may be connected to each other through the first connection portions CP1.

Each of the second sensing electrodes IE2-1 to IE2-5 includes second sensor portions SP2 disposed apart from each other in the second direction DR2. The second sensing electrodes IE2-1 to IE2-5 are disposed apart from each other in the first direction DR1. That is, the second sensor portions SP2 of the second sensing electrodes IE2-1 to IE2-5 are disposed apart from each other in the first direction DR1 and the second direction DR2. Each of the second sensor portions SP2 may have a polygonal (for example, rhombic) mesh shape and include a metal to improve flexibility.

Referring to FIGS. 10 and 11, the first trace lines TL1-1 to TL1-4 of the first conductive layer IS-CL1 are connected to the first sensing electrodes IE1-1 to IE1-4 of the second conductive layer IS-CL2 via first contact holes CNT1-1 to CNT1-4, respectively. Each of the trace electrodes TE1 to TE4 may have the same shape and size as the corresponding first sensing electrode of the first sensing electrodes IE1-1 to IE1-4.

The second trace lines TL2-1 to TL2-5 of the first conductive layer IS-CL1 are electrically connected to the second sensing electrodes IE2-1 to IE2-5 of the second conductive layer IS-CL2 via second contact holes CNT2-1 to CNT2-5, respectively.

The trace portion TP of each of the second trace lines TL2-1 to TL2-5 may have the same shape and size as the corresponding second sensing electrode of the second sensing electrodes IE2-1 to IE2-5.

In the example illustrated in FIG. 11, the number of the first sensing electrodes IE1-1 to IE1-4 is smaller than the number of the second sensing electrodes IE2-1 to IE2-5. In this case, each of the trace electrodes TE1 to TE4 may have the same shape and size as the corresponding first sensing electrode of the first sensing electrodes IE1-1 to IE1-4.

In the example illustrated in FIG. 6, the number of the first sensing electrodes IE1-1 to IE1-7 is greater than the number of the second sensing electrodes IE2-1 to IE2-5. In this case, each of the trace electrodes TE1 to TE7 has a small size and, for example, may be half the size of the corresponding first sensing electrode of the first sensing electrodes IE1-1 to IE1-7. As described above, even though the number of the first sensing electrodes IE1-1 to IE1-7 is greater than the number of the second sensing electrodes IE2-1 to IE2-5, all of the first trace lines TL1-1 to TL1-4 may be disposed in the active area AA by reducing the surface areas (sizes) of the trace electrodes TE1 to TE7.

In the input sensor unit of the display device having the structure described above, the signal lines are disposed in the active area, and thus the bezel area may be minimized. In the display device according to exemplary the embodiment of the inventive concepts, all of the signal lines of the input sensor unit may be disposed in the active area even though the lengths in the first and second directions are different from each other. Also, in the display device according to the embodiment of the inventive concepts, the lengths of the signal lines of the input sensor unit are equal to each other, and thus the noise difference between the signal lines may be minimized.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel comprising an active area and a peripheral area disposed outside the active area; and
    an input sensing layer disposed on the display panel, the input sensing layer comprising a first conductive layer, a second conductive layer, and an insulating layer disposed between the first conductive layer and the second conductive layer,
    wherein:
    the first conductive layer comprises first trace lines and second trace lines insulated from the first trace lines;
    the second conductive layer comprises first sensing electrodes extending in a first direction and disposed apart from each other in a second direction, and second sensing electrodes disposed apart from each other in the first direction and the second direction;
    the first trace lines extend in the second direction, are disposed apart from each other in the first direction, and are electrically connected to the first sensing electrodes, respectively;
    the second trace lines extend in the second direction, are disposed apart from each other in the first direction, and are electrically connected to the second sensing electrodes, respectively;
    the first conductive layer and the second conductive layer overlap the active area of the display panel;
    each of the first trace lines comprises:
        a first trace electrode which overlaps a corresponding one of the first sensing electrodes; and
        a line portion which is electrically connected to the first trace electrode and extends in the second direction; and,
    when the number of the first sensing electrodes is less than or equal to the number of the second sensing electrodes, a size of the first trace electrode is equal to a size of the corresponding one of the first sensing electrodes.

2. The display device of claim 1, wherein the input sensing layer further comprises:
    first signal lines connected to the first trace lines; and
    second signal lines connected to the second trace lines.

3. The display device of claim 2, wherein the first signal lines and the second signal lines overlap the peripheral area of the display panel.

4. The display device of claim 2, wherein the first signal lines and the second signal lines are provided in the first conductive layer.

5. The display device of claim 1, wherein:
    each of the second trace lines comprises:
        trace portions, each of which overlaps a corresponding one of the second sensing electrodes; and
        a connection electrode which electrically connects the trace portions;

each of the trace portions is electrically connected to a corresponding one of the second sensing electrodes via a contact hole that passes through the insulating layer; and the contact hole is disposed directly below the corresponding one of the second sensing electrodes.

6. The display device of claim 5, wherein each of the first sensing electrodes and the second sensing electrodes has a mesh shape.

7. The display device of claim 6, wherein the first trace electrode has a mesh shape.

8. The display device of claim 1, wherein the display panel comprises:
a base layer comprising the active area and the peripheral area;
a circuit element layer which comprises a pixel disposed in the active area of the base layer;
a light emitting element layer which comprises light emitting elements provided on the circuit element layer; and
a thin film encapsulation layer configured to cover the light emitting element layer and comprising an organic layer.

9. The display device of claim 8, wherein the first conductive layer of the input sensing layer is disposed directly on a top portion of the thin film encapsulation layer.

10. The display device of claim 9, further comprising an anti-reflection unit configured to reduce reflectivity of external light,
wherein the anti-reflection unit is disposed on the thin film encapsulation layer.

11. A display device comprising:
a display panel comprising an active area and a peripheral area disposed outside the active area; and
an input sensing layer disposed on the display panel, the input sensing layer comprising a first conductive layer, a second conductive layer, and an insulating layer disposed between the first conductive layer and the second conductive layer,
wherein:
the first conductive layer comprises first trace lines and second trace lines insulated from the first trace lines;
the second conductive layer comprises first sensing electrodes extending in a first direction and disposed apart from each other in a second direction, and second sensing electrodes disposed apart from each other in the first direction and the second direction;
the first trace lines extend in the second direction, are disposed apart from each other in the first direction, and are electrically connected to the first sensing electrodes, respectively;
the second trace lines extend in the second direction, are disposed apart from each other in the first direction, and are electrically connected to the second sensing electrodes, respectively;
the first conductive layer and the second conductive layer overlap the active area of the display panel;

each of the second trace lines comprises:
trace portions, each of which overlaps a corresponding one of the second sensing electrodes; and
a connection electrode which electrically connects the trace portions; and
a size of each of the trace portions is equal to a size of the corresponding one of the second sensing electrodes.

12. The display device of claim 11, wherein the input sensing layer further comprises:
first signal lines connected to the first trace lines; and
second signal lines connected to the second trace lines.

13. The display device of claim 12, wherein the first signal lines and the second signal lines overlap the peripheral area of the display panel.

14. The display device of claim 12, wherein the first signal lines and the second signal lines are provided in the first conductive layer.

15. The display device of claim 11, wherein:
each of the second trace lines comprises:
trace portions, each of which overlaps a corresponding one of the second sensing electrodes; and
a connection electrode which electrically connects the trace portions;
each of the trace portions is electrically connected to a corresponding one of the second sensing electrodes via a contact hole that passes through the insulating layer; and
the contact hole is disposed directly below the corresponding one of the second sensing electrodes.

16. The display device of claim 15, wherein each of the first sensing electrodes and the second sensing electrodes has a mesh shape.

17. The display device of claim 16, wherein each of the trace portions has a mesh shape.

18. The display device of claim 11, wherein the display panel comprises:
a base layer comprising the active area and the peripheral area;
a circuit element layer which comprises a pixel disposed in the active area of the base layer;
a light emitting element layer which comprises light emitting elements provided on the circuit element layer; and
a thin film encapsulation layer configured to cover the light emitting element layer and comprising an organic layer.

19. The display device of claim 18, wherein the first conductive layer of the input sensing layer is disposed directly on a top portion of the thin film encapsulation layer.

20. The display device of claim 19, further comprising an anti-reflection unit configured to reduce reflectivity of external light,
wherein the anti-reflection unit is disposed on the thin film encapsulation layer.

* * * * *